US011038101B2

(12) United States Patent
Lin et al.

(10) Patent No.: US 11,038,101 B2
(45) Date of Patent: Jun. 15, 2021

(54) SEMICONDUCTOR STRUCTURE HAVING A PHASE CHANGE MEMORY DEVICE

(71) Applicant: TAIWAN SEMICONDUCTOR MANUFACTURING COMPANY LTD., Hsinchu (TW)

(72) Inventors: Hsing-Lien Lin, Hsin-Chu (TW); Hai-Dang Trinh, Hsinchu (TW); Fa-Shen Jiang, Taoyuan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/157,736

(22) Filed: Oct. 11, 2018

(65) Prior Publication Data
US 2019/0157551 A1 May 23, 2019

Related U.S. Application Data

(60) Provisional application No. 62/589,220, filed on Nov. 21, 2017.

(51) Int. Cl.
*H01L 45/00* (2006.01)
*H01L 27/24* (2006.01)

(52) U.S. Cl.
CPC ........... *H01L 45/06* (2013.01); *H01L 45/126* (2013.01); *H01L 45/1233* (2013.01);
(Continued)

(58) Field of Classification Search
CPC . H01L 45/06; H01L 45/1233; H01L 45/1253; H01L 45/126; H01L 45/1286; H01L 45/16; H01L 45/1683
See application file for complete search history.

(56) References Cited

U.S. PATENT DOCUMENTS 7,545,019 B2 * 6/2009 Philipp ................. H01L 45/148
257/503
7,638,786 B2 * 12/2009 Matsui ................ C23C 14/0623
257/2
(Continued)

FOREIGN PATENT DOCUMENTS

CN 101026178 A 8/2007
CN 101197317 A 6/2008
(Continued)

OTHER PUBLICATIONS

Office Action and Search Report dated May 4, 2020 issued by Taiwan Intellectual Property Office for counterpart application No. 107141118.
(Continued)

*Primary Examiner* — Ida M Soward
(74) *Attorney, Agent, or Firm* — WPAT, P.C., Intellectual Property Attorneys; Anthony King

(57) ABSTRACT

A semiconductor structure includes a first conductive layer and a second conductive layer, and a memory device between the first conductive layer and the second conductive layer. The memory device includes a top electrode, a bottom electrode adjacent to the first conductive layer, and a phase change material between the top electrode and the bottom electrode. The bottom electrode includes a first portion and a second portion between the first portion and the first conductive layer.

20 Claims, 10 Drawing Sheets

(52) U.S. Cl.
CPC ...... *H01L 45/1253* (2013.01); *H01L 45/1286* (2013.01); *H01L 45/16* (2013.01); *H01L 45/1683* (2013.01); H01L 27/2436 (2013.01); H01L 45/144 (2013.01); H01L 45/148 (2013.01)

(56) References Cited

U.S. PATENT DOCUMENTS

| | | | |
|---|---|---|---|
| 7,755,075 B2 | 7/2010 | Hayakawa | |
| 7,812,332 B2 | 10/2010 | Oh et al. | |
| 7,847,374 B1* | 12/2010 | Wang | H01L 27/1026 257/560 |
| 7,884,343 B2* | 2/2011 | Lung | H01L 45/1641 257/2 |
| 7,902,539 B2 | 3/2011 | Moniwa et al. | |
| 8,049,196 B2 | 11/2011 | Jung | |
| 8,423,506 B2 | 4/2013 | Celi, Jr. et al. | |
| 8,503,216 B2* | 8/2013 | Kajiyama | H01L 27/228 365/148 |
| 8,824,195 B2* | 9/2014 | Hwang | H01L 27/2409 365/153 |
| 9,029,173 B2* | 5/2015 | Or-Bach | H01L 27/11551 438/17 |
| 10,157,951 B2* | 12/2018 | Kim | H04N 5/37457 |
| 10,263,066 B2* | 4/2019 | Hiroi | H01L 23/5329 |
| 10,283,564 B1* | 5/2019 | Liu | H01L 27/2463 |
| 10,374,010 B2* | 8/2019 | Wu | H01L 45/144 |
| 10,566,385 B2* | 2/2020 | Lee | H01L 27/20 |
| 10,622,051 B2* | 4/2020 | Muller | G11C 11/2273 |
| 2002/0004296 A1* | 1/2002 | Reinberg | H01L 45/06 438/597 |
| 2003/0193063 A1* | 10/2003 | Chiang | H01L 45/1253 257/295 |
| 2007/0099377 A1* | 5/2007 | Happ | H01L 45/06 438/257 |
| 2008/0099753 A1* | 5/2008 | Song | H01L 27/2409 257/2 |
| 2008/0121862 A1* | 5/2008 | Liu | G11C 13/0004 257/4 |
| 2008/0280390 A1* | 11/2008 | Kim | H01L 45/1683 438/95 |
| 2010/0207095 A1* | 8/2010 | Lai | H01L 45/1641 257/4 |
| 2010/0261329 A1* | 10/2010 | Lung | H01L 45/06 438/381 |
| 2011/0315946 A1* | 12/2011 | Ko | H01L 27/2409 257/4 |
| 2012/0228577 A1* | 9/2012 | Park | H01L 45/06 257/4 |
| 2014/0063943 A1* | 3/2014 | Nagashima | G11C 5/145 365/185.08 |
| 2016/0064270 A1* | 3/2016 | Lee | H01L 21/764 438/655 |
| 2016/0247760 A1* | 8/2016 | Lee | H01L 23/5329 |
| 2017/0243922 A1* | 8/2017 | Eun | H01L 23/528 |

FOREIGN PATENT DOCUMENTS

| | | |
|---|---|---|
| CN | 101447501 A | 6/2009 |
| CN | 101552282 A | 10/2009 |
| TW | 200835008 | 8/2008 |
| TW | 201214816 | 4/2012 |

OTHER PUBLICATIONS

U.S. Pat. No. 7,812,332 is the English counterpart application to Foreign Reference TW200835008.
U.S. Pat. No. 8,423,506 is the English counterpart application to Foreign Reference TW201214816.
Office Action and Search Report dated Jun. 22, 2020 issued by China National Intellectual Property Administration for counterpart application No. 201811366380.5.

* cited by examiner

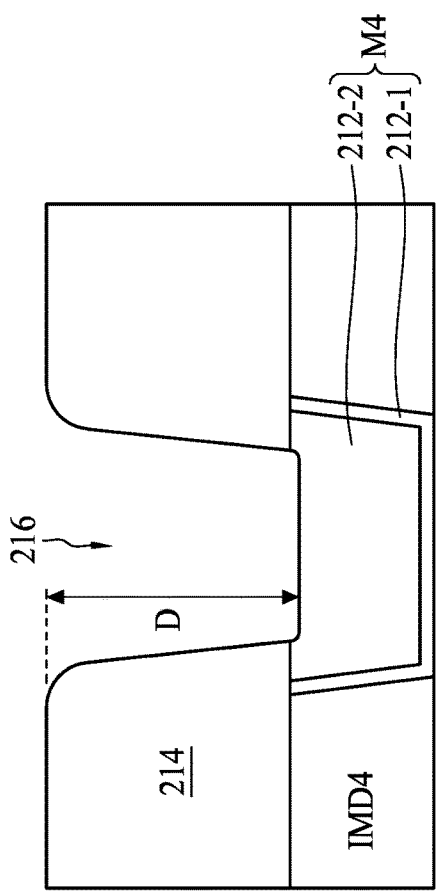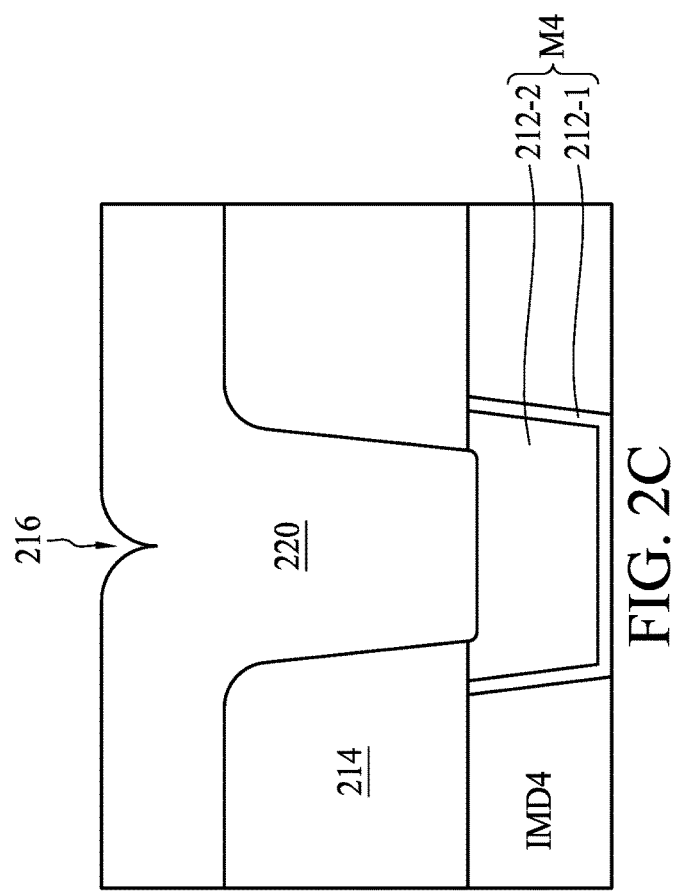

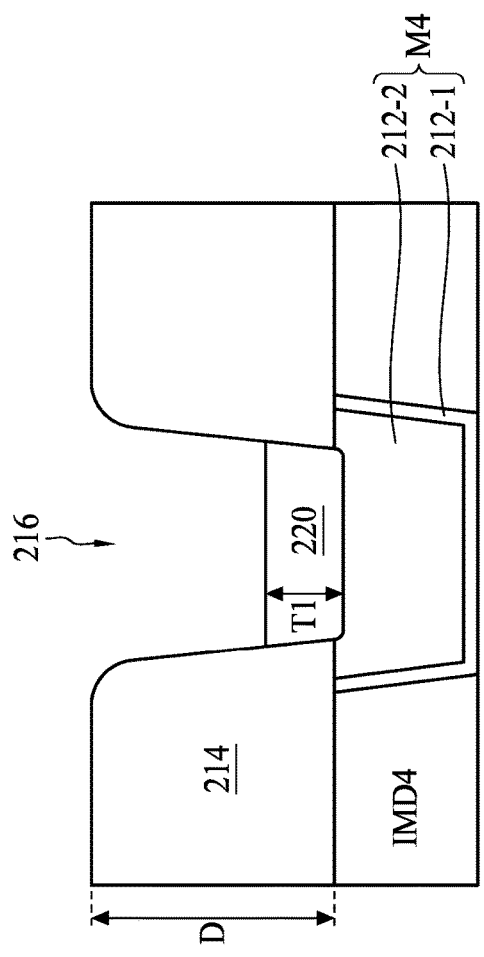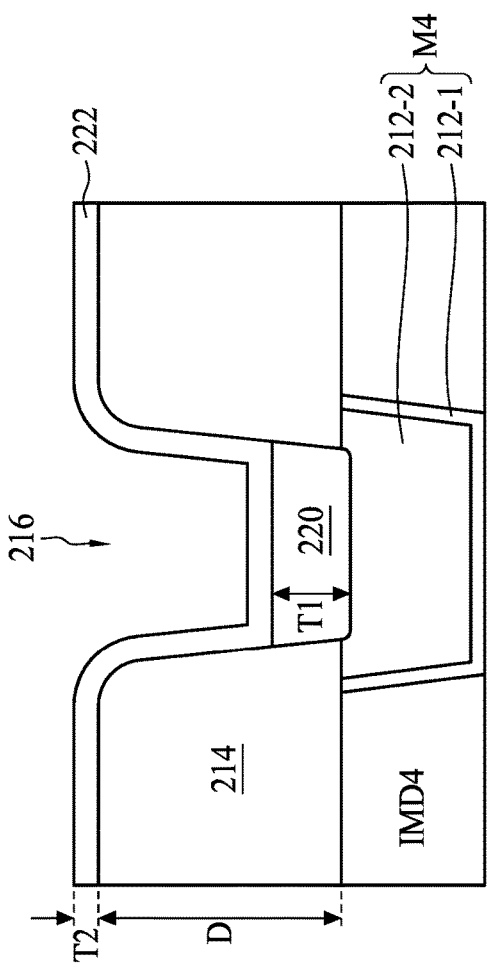

SEMICONDUCTOR STRUCTURE HAVING A PHASE CHANGE MEMORY DEVICE

PRIORITY DATA

This patent claims the benefit of U.S. Provisional Patent Application Ser. No. 62/589,220 filed Nov. 21, 2017, the entire disclosure of which is hereby incorporated by reference.

BACKGROUND

Phase change technology is promising for next generation memories. It uses chalcogenide semiconductors for storing data. The chalcogenide semiconductors, also called phase change materials, have a crystalline state and an amorphous state. In the crystalline state, the phase change materials have a low resistivity, while in the amorphous state the phase change materials have a high resistivity, and thus the phase change memory devices are unlikely to have erroneous reading. The chalcogenide semiconductor materials are stable at certain temperature ranges in both crystalline and amorphous states and can be switched back and forth between the two states by electric pulses. One type of memory device that uses the principle of phase change in chalcogenide semiconductors is commonly referred to as phase change random access memory (PCRAM).

PCRAM has several operating and engineering advantages, including high speed, low power, non-volatile, high density, and low cost. In addition, PCRAM memory cells ae compatible with CMOS logic and can generally be produced at a low cost compared to other types of memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2I are schematic drawings illustrating a semiconductor structure at various fabrication stages constructed according to aspects of the present disclosure in one or more embodiments.

DETAILED DESCRIPTION

Figure 1:
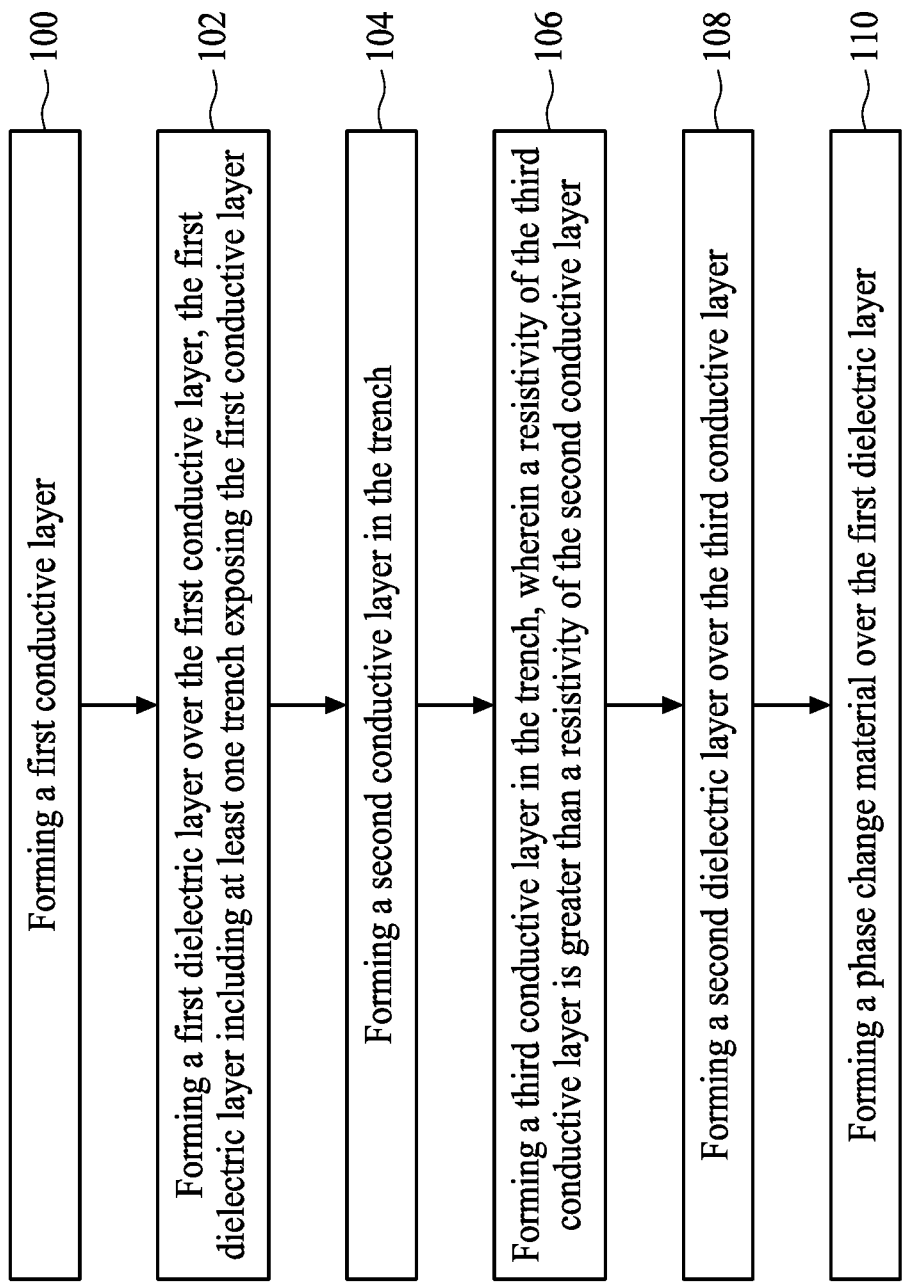
FIG. 1 shows a flow chart representing method for forming a semiconductor structure according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

A phase change memory (PCM) cell includes a phase change material arranged over a heating element and a dielectric element surrounded by and abutting the heating element. Further, a top electrode is arranged over the phase change element, and a bottom electrode is arranged below the heating elements. In some embodiments, the phase change memory cell is integrated in an interconnect structure, and thus a metal layer or a via may serve as the bottom electrode of the phase change memory cell. The data state of the phase change memory cell is switched between "1" and "0" by heating the phase change material to cause reversible switches between crystalline and amorphous state of the phase change material. However, it is found that the heat also causes metal diffusion from the metal layer that is serving as the bottom electrode. Consequently, metal loss is caused due to the high temperature required to cause the state switch. The metal loss issue adversely impacts the reliability of the interconnect structure. Further, the metal loss issue can even form an open circuit in the interconnect structure as a size of the heating element is reduced to less than 65 nanometers (nm).

The present disclosure therefore provides a semiconductor structure including a memory device and a method for forming the same. In the semiconductor structure, a heat-buffering layer is introduced between the heating element of the memory device and the metal layer of the interconnect structure, and thus heat required to cause the state change for the phase change material is buffered from the metal layer in the interconnect structure. Consequently, metal diffusion and metal loss issue are both mitigated by the heat-buffering layer, and thus reliability of the phase change memory cell and the interconnect structure are both improved.

FIG. 1 shows a flow chart representing a method for forming a semiconductor structure 10 according to aspects of the present disclosure. In some embodiments, the method 10 includes an operation 100: forming a first conductive layer. The method 10 further includes an operation 102: forming a first dielectric layer over the first conductive layer, the first dielectric layer including at least one trench exposing the first conductive layer. The method 10 further includes an operation 104: forming a second conductive layer in the trench. The method 10 further includes an operation 106: forming a third conductive layer in the trench, wherein a resistivity of the third conductive layer is greater than a resistivity of the second conductive layer. The method 10 further includes an operation 108: forming a second dielectric layer over the third conductive layer. The method 10 further includes an operation 110: forming a phase change material over the first dielectric layer. The method 10 will be further described according to one or more embodiments. It should be noted that the operations of the method for forming the semiconductor structure 10 may be rearranged or otherwise modified within the scope of the various aspects. It is further noted that additional operations may be provided before, during, and after the method 10, and that some other operations may only be briefly described herein. Thus other implementations are possible within the scope of the various aspects described herein.

Figure 2A:
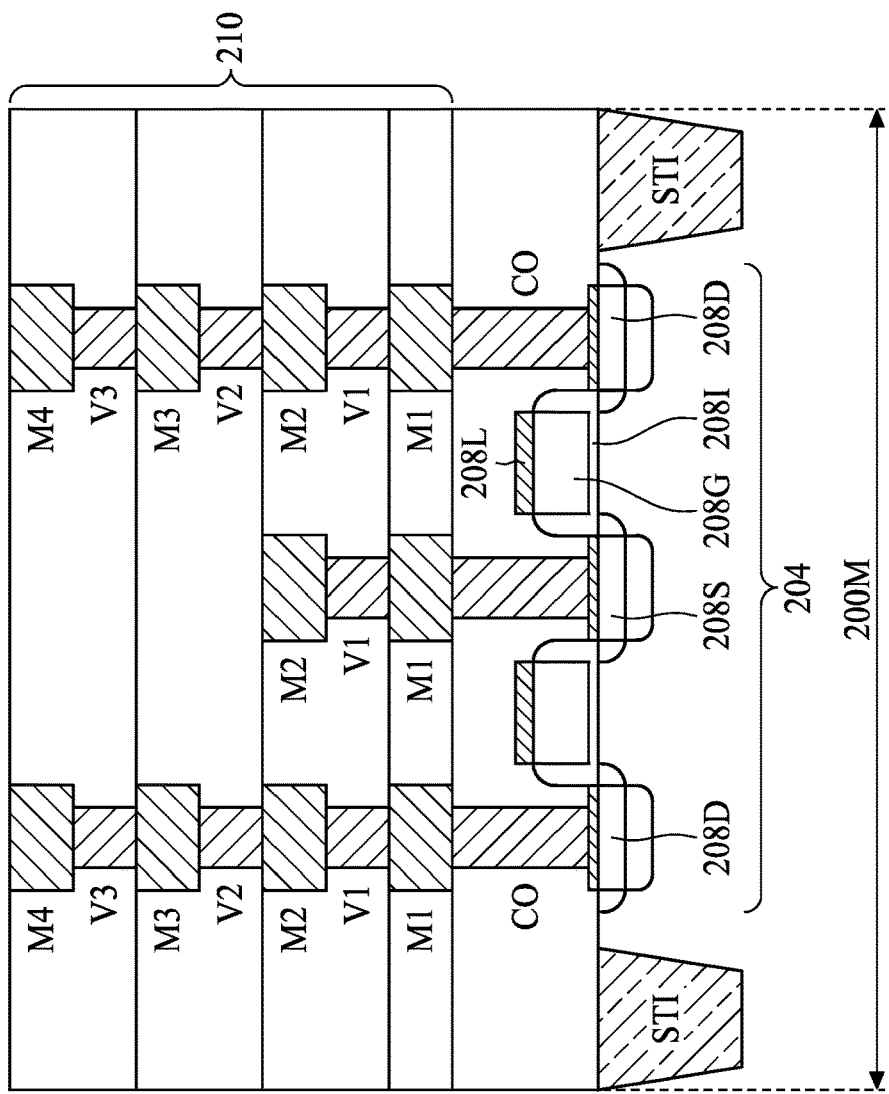
Figure 2A:
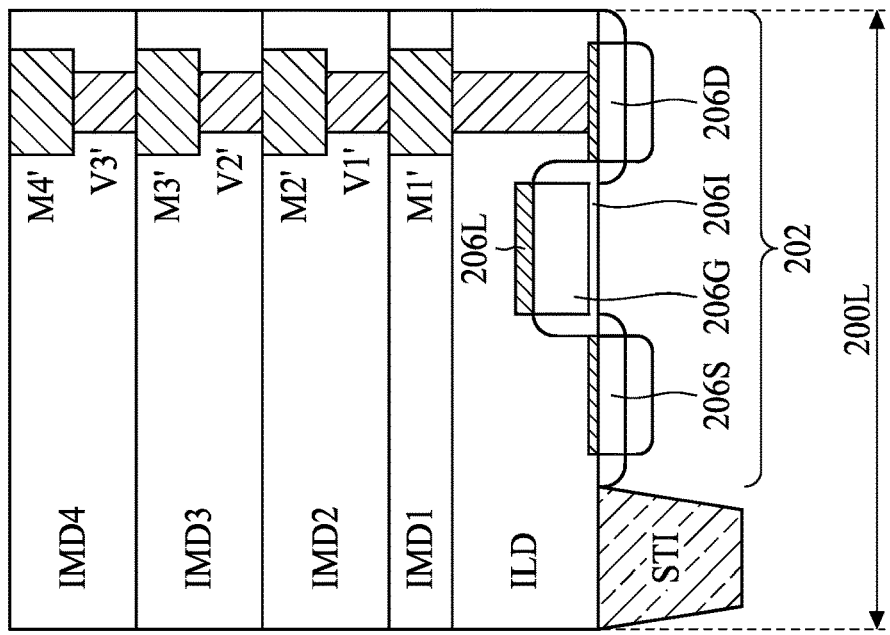

FIGS. 2A-2I are schematic drawings illustrating a semiconductor structure including a memory device at various fabrication stages constructed according to aspects of the present disclosure in one or more embodiments. Further, FIGS. 2A-2H are enlarged views of a portion of the semiconductor structure including the memory device at various fabrication stages constructed according to aspects of the present disclosure in one or more embodiments. Referring to FIG. 2A, a substrate can be received. The substrate may be a semiconductor substrate formed of commonly used semiconductor materials such as silicon (Si), silicon germanium (SiGe), gallium arsenide (GaAs), and the like, and may be a bulk substrate or a semiconductor-on-insulator (SOI) substrate. In some embodiments, the substrate can include a plurality of functional regions. The plurality of functional regions can be defined and electrically isolated from each other by isolation structures, such as shallow trench isolations (STIs), but the not limited thereto. For example but not limited to, the substrate can include a logic region 200L and a memory region 200M that are defined and electrically isolated from other functional regions by the STIs. The logic region 200L may include circuitry, such as the exemplary transistor 202, for processing information received from memory cells and for controlling reading and writing functions of the memory cells. In some embodiments, access transistors 204 are disposed in the memory region 200M. The transistor 202 in the logic region 200L can include a gate dielectric layer 206I a gate conductive layer 206G, source/drain regions 206S/206D, and silicides 206L, but the disclosure is not limited to this. The access transistors 204 in the memory region 200M can include a gate dielectric layer 208I, a gate conductive layer 208G, source/drain regions 208S/208D, and silicides 208L, but the disclosure is not limited to this. For simplicity, components such as spacers and contact etch stop layer (CESL) that are commonly formed in integrated circuits are not illustrated and/or detailed.

Still referring to FIG. 2A, an inter-layer dielectric layer ILD is formed over the transistor 202 and the access transistors 204, and contact plugs CO are formed in the inter-layer dielectric layer ILD for providing electrical connections between other circuitry/elements and the source/drain regions 206S/206D of the transistor 204, and between other circuitry/elements and the source/drain regions 208S/208D of the access transistors 204. The formation operations of the contact plugs CO can include forming openings in the inter-layer dielectric layer ILD, filling the openings and performing a planarization such as chemical mechanical polish (CMP). For simplicity, the gate contact plug is not shown, although it is also formed simultaneously with the contact plugs CO shown in FIG. 2A. In some embodiments, the contact plugs CO can include tungsten (W), but other suitable conductive material such as silver (Ag), aluminum (Al), copper (Cu), AlCu, and the like may also be used or added.

Still referring to FIG. 2A, an interconnect structure 210 is disposed over the inter-layer dielectric layer ILD and the contact plugs CO. In some embodiments, the interconnect structure 210 includes a plurality of conductive layers. For example, the interconnect structure 210 includes a plurality of metal layers labeled as M1 through M4 and a plurality of conductors labeled as V1 through V3. Further, the metal layers M1 through M4 and the conductors V1 through V4 are disposed in a plurality of inter-metal dielectric layers labeled as IMD1 through IMD4. The inter-metal dielectric layers IMD1 through IMD4 may provide electrical insulating as well as structural support for the various features during many fabrication operations. In some embodiments, the inter-metal dielectric layer IMD1 through IMD4 may be formed of low-k dielectric material, for example, with k value lower than about 3.0, and even lower than about 2.5, but the disclosures is not limited to this. In some embodiments, a memory device can be integrated in the interconnect structure 210. For example, the memory device can be integrated over the metal layer M4 and the inter-metal dielectric layer IMD4, but the disclosure is not limited to this. In other words, the memory device can be integrated over any of the metal layers Mn and the inter-metal dielectric layer IMDn, and n is a positive integer. In some embodiments, the formation operations of the metal layers Mn and the conductors Vn can include forming openings in the inter-metal dielectric layer IMDn, filling the openings and performing a planarization such as chemical mechanical polish (CMP). In some embodiments, the metal layers M1 through M4 and the conductor V1 through V4 can include W, Al, Cu, AlCu, and the like. Additionally, a barrier layer (not shown) can be disposed between at least the metal layers M1 through M4 and the inter-metal layers IMD1 through IMD4.

Please refer to FIG. 2B, in some embodiments, a first lower conductive layer such as the metal layer M4 is provided according to operation 100. However in some embodiments, the first lower conductive layer can be any of the metal layers Mn, and n is a positive integer, as mentioned above. In some embodiments, a trench may be formed in the inter-metal dielectric layer (IMD), a barrier layer 212-1 may formed to line a bottom and sidewalls of the trench, and a conductor layer 212-2 may be formed to fill the trench. In some embodiments, a planarization may be performed to remove superfluous conductor layer 212-2 and/or barrier layer 212-1. It should be understood that to mitigate metal diffusion, which may adversely affect electrical isolation of the surrounding IMD layers, the barrier layer 212-1 may be required. Therefore, the conductor layer 212-2 may be enclosed or encapsulated by the barrier layer 212-1. Next, a first dielectric layer 214, such as an inter-metal dielectric layer IMD5, is formed over the first lower conductive layer M4. At least one trench 216 is formed in the first dielectric layer 214, and the first lower conductive layer M4 is exposed from the trench 216, as shown in FIG. 2B. In some embodiments, a depth D of the trench 216 can be between approximately 250 angstroms (Å) and approximately 500 Å, but the disclosure is not limited to this.

A bottom conductive layer 220 is formed in the trench 216 according to operation 104. In some embodiments, the formation of the second conductive layer 220 in the trench 216 further includes forming the bottom conductive layer 220 over the first dielectric layer 214 to fill the trench 216 as shown in FIG. 2C. In some embodiments, the first lower conductive layer M4 includes Cu, and the bottom conductive layer 220 in the trench 216 can include conductive materials that are able to be a Cu diffusion barrier. For example but not limited to, the bottom conductive layer 220 in the trench 216 can include tantalum nitride (TaN), tantalum (Ta), titanium nitride (TiN), tungsten nitride (WN), W, palladium (Pd), nickel (Ni), nickel chromium (NiCr), zirconium (Zr), and niobium (Nb).

Referring to FIG. 2D, the bottom conductive layer 220 in the trench 216 is then etched back by any suitable etchant. Accordingly, a top surface of the bottom conductive layer 220 in the trench 216 is lower than an opening of the trench 216. In some embodiments, a thickness T1 of the bottom conductive layer 220 in the trench 216 can be equal to or greater than 50 Å, but the disclosure is not limited to this. However, the thickness T1 of the bottom conductive layer 220 in the trench 216 can be limited by, for example but not limited to, an aspect ratio of the trench 216, as long as the thickness T1 is less than the depth D of the trench 216.

Referring to FIG. 2E, a conductive layer serving as a heat-spreading layer 222 is formed in the trench 216 according to operation 106. The heat-spreading layer 222 is conformally formed in the trench 216 and on the bottom conductive layer 220 in the trench 216, and thus the heat-spreading layer 222 is in contact with a top surface of the bottom conductive layer 220 and a portion of sidewalls of the trench 216, as shown in FIG. 2E. Accordingly, the heat-spreading layer 222 is spaced apart from the first lower conductive layer M4 by the bottom conductive layer 220. More importantly, a resistivity of the heat-spreading layer 222 is greater than a resistivity of the bottom conductive layer 220. Further, a thermal conductivity of the heat-spreading layer 222 is less than a thermal conductivity of the bottom conductive layer 220. In some embodiments, a thickness T2 of the heat-spreading layer 222 can be equal to or greater than 30 Å, but the disclosure is not limited to this. In some embodiments, the thickness T2 of the heat-spreading layer 222 can be between about 30 Å and about 200 Å, but the disclosure is not limited to this. However, it should be easily realized that the thickness T2 of the heat-spreading layer 222 can be limited by, for example but not limited to, an aspect ratio of the trench 216. In some embodiments, the heat-spreading layer 222 includes TiN, but other suitable conductive material such as TaN or TaAlN may be used. Further, the heat-spreading layer 222 can be formed by atomic layer deposition (ALD), but the disclosure is not limited to this. In some embodiments, the bottom conductive layer 220 and the heat-spreading layer 222 can include the same material. In other embodiments, the bottom conductive layer 220 and the heat-spreading layer 222 can include different materials.

Figure 2F:
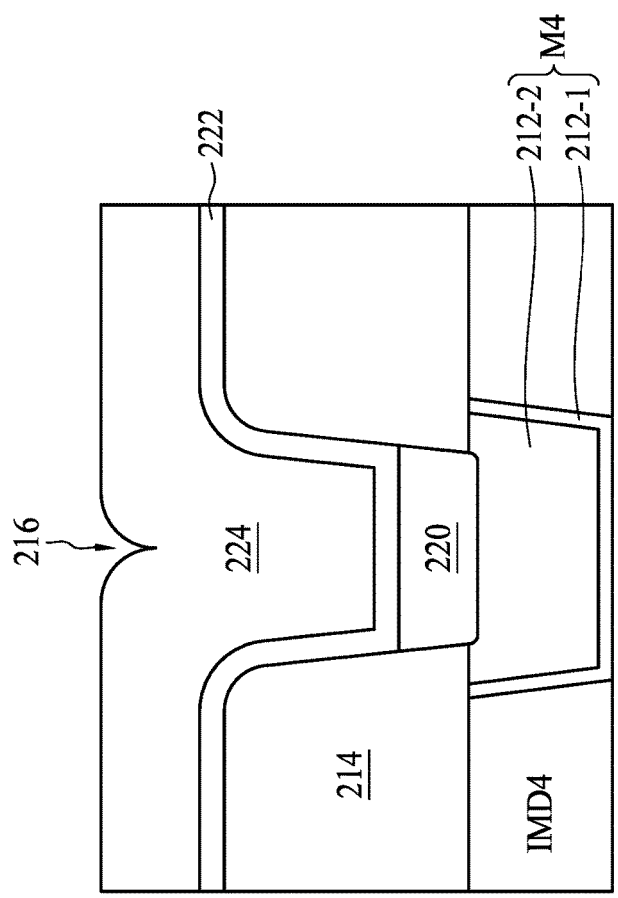
Figure 2G:
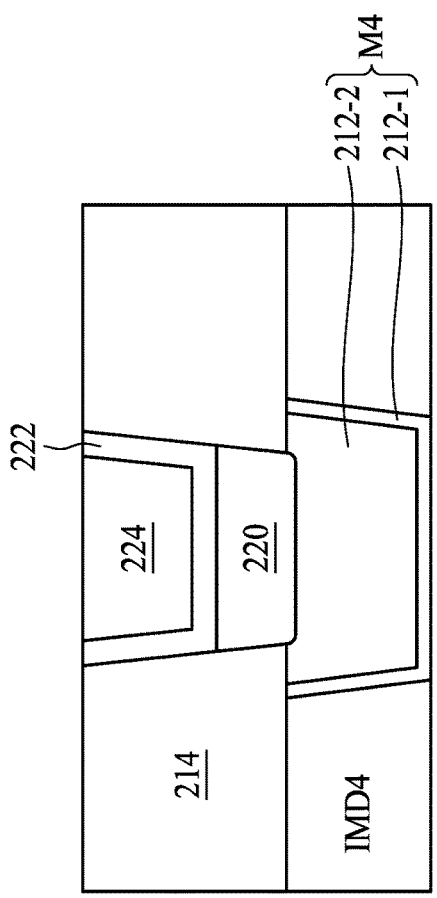

Referring to FIG. 2F, a second dielectric layer 224 is formed over the heat-spreading layer 222 according to operation 108. The second dielectric layer 224 can include silicon oxide (SiO), silicon nitride (SiN), or silicon oxynitride (SiON), but the disclosure is not limited to this. In some embodiments, the second dielectric layer 224 and the first dielectric layer 214 can include the same material, but the disclosure is not limited to this. Further, the second dielectric layer 224 is formed to fill the trench 216, as shown in FIG. 2F. Subsequently, a planarization such as CMP operation is performed to remove a portion of the second dielectric layer 224 and a portion of the heat-spreading layer 222, such that the first dielectric layer 214, the second dielectric layer 224 and the heat-spreading layer 222 are all exposed as shown in FIG. 2G.

Figure 2H:
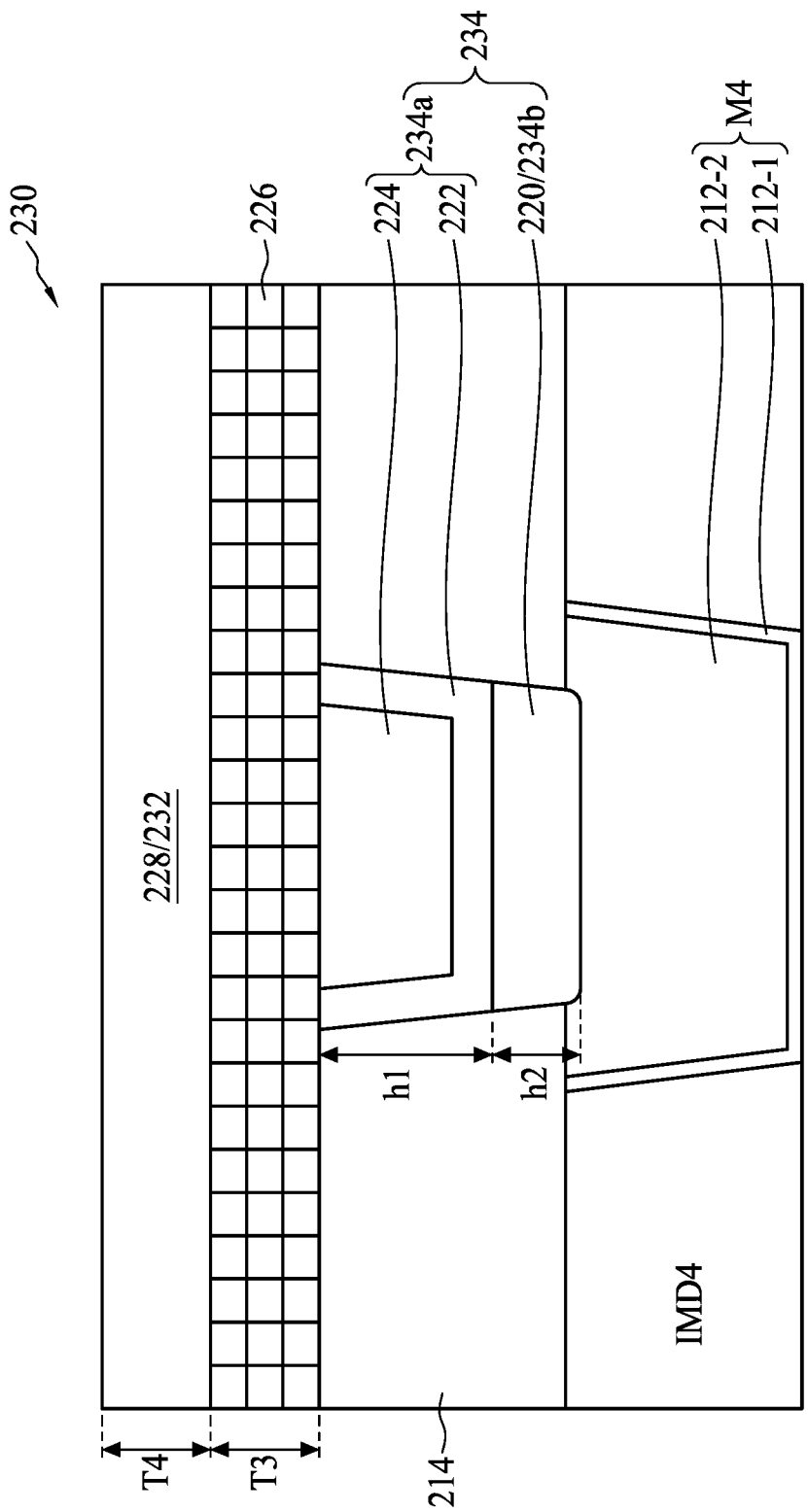

Referring to FIG. 2H, a phase change material 226 is then formed over the first dielectric layer 214, the second dielectric layer 224 and the heat-spreading layer 222 according to operation 110. In some embodiments, a thickness T3 of the phase change material 226 can be between about 300 Å and about 400 Å, but the disclosure is not limited to this. In some embodiments, the phase change material 226 can include chalcogenide materials including one or more of germanium (Ge), tellurium (Te) and antimony (Sb) or stoichiometric materials. In some embodiments, the phase change material 226 can include a Ge)— Sb—Te (GST) compound such as $Ge_2Sb_2Te_5$ (also referred to as GST225), but the disclosure is not limited to this. In some embodiments, the phase change material 226 can include Si—Sb—Te compounds, Ga—Sb—Te compounds, As—Sb—Te compounds, Ag—In—Sb—Te compounds, Ge—In—Sb—Te compounds, Ge—Sb compounds, Sb—Te compounds, Si—Sb compounds, and combinations thereof. The phase change material 226 is chosen to be a material that will undergo a phase change such as from amorphous to crystalline or vice-versa when heated by the heat-spreading layer 222.

Still referring to FIG. 2H, subsequently a top conductive layer 228 is formed over the phase change material 226, and thus a memory device 230 is obtained. In some embodiments, a thickness T4 of the top conductive layer 228 is about 400 Å, but the disclosure is not limited to this. In the memory device 230, the top conductive layer 228 over the phase change material 226 serves as a top electrode 232 while the bottom conductive layer 220, the heat-spreading layer 222 and the second dielectric layer 224 serve as a bottom electrode 234. Accordingly, the memory device 230 includes the top electrode 232, the bottom electrode 234 adjacent to the first lower conductive layer M4, and the phase change material 226 between the top electrode 232 and the bottom electrode 234. Further, the bottom electrode 234 includes a first portion 234a and a second portion 234b between the first portion 234a and the first lower conductive layer M4. The first portion 234a and the second portion 234b can include different materials. As shown in FIG. 2H, the heat-spreading layer 222 and the second dielectric layer 224 form the first portion 234a, and the bottom conductive layer 220 forms the second portion 234b. Since the resistivity of the heat-spreading layer 222 is greater than the resistivity of the bottom conductive layer 220, more heat will be generated by the heat-spreading layer 222. Accordingly, the bottom conductive layer 220 serves as a heat-buffering layer. In some embodiments, the thickness T1 of the heat-buffering layer 220 is greater than the thickness T2 of the heat-spreading layer 222, as shown in FIG. 2E. However, a height h1 of the first portion 234a (including the heat-spreading layer 222 and the second dielectric layer 224) and a height h2 of the second portion 234b (including the bottom conductive layer 220) include a ratio, and the ratio is between about 4 and about 9, but the disclosure is not limited to this. More importantly, the heat-buffering layer 220 is disposed between the heat-spreading layer 222 and the first lower conductive layer M4. Further, the heat-spreading layer 222 is in a ring shape from a top plan view, and the bottom and the sidewall of the second dielectric layer 224 are in contact with the heat-spreading layer 222. And the heat-buffering layer 220 is in contact with an entire bottom surface of the heat-spreading layer 222. Further, an outer surface of the ring-shaped heat-spreading layer 222 is aligned with and coupled to a sidewall surface of the heat-buffer layering 220.

Figure 2I:
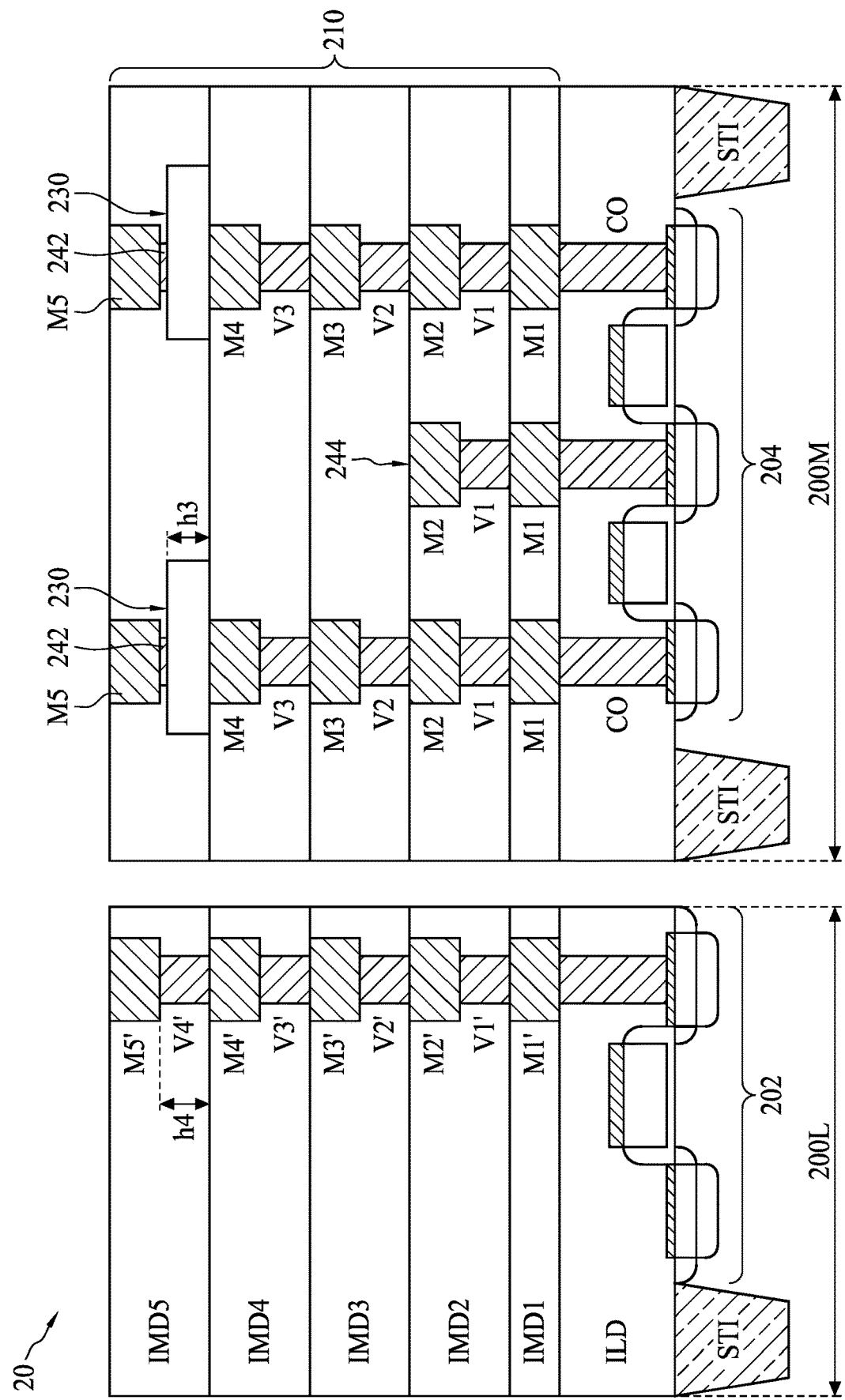

Referring to FIG. 2I, in some embodiments, a first upper conductive layer M5 can be formed over the memory device 230, and a top conductor 242 can be disposed between the first upper conductive layer M5 and the memory device 230 for providing electrical connection. The top conductor 242 is disposed between the top electrode 232 of the memory device 230 and the first upper conductive layer M5. As mentioned above, the memory device 230 can be integrated in the interconnect structure 210, therefore in some embodiments, the first dielectric layer 214 can be formed simultaneously with an inter-metal dielectric layer IMD5. Similarly, the top conductor 242 can be formed simultaneously with the conductor V5, and the first upper conductive layer M5 can be formed simultaneously with other conductive layer in the inter-metal layer IMD5, such as the metal layer M5' in the logic region 200L, as shown in FIG. 2I.

Accordingly, a semiconductor structure 20 is therefore obtained. The semiconductor structure 20 can include the first lower conductive layer (i.e., the metal layer M4), the first upper conductive layer (i.e., the metal layer M5), and the memory device 230 disposed between the first lower conductive layer M4 and the first upper conductive layer M5. As mentioned above, the memory device 230 includes the top electrode 232, the bottom electrode 234 adjacent to the first lower conductive layer M4, and the phase change material 226 between the top electrode 232 and the bottom electrode 234. In some embodiments, the semiconductor structure 20 includes the inter-metal dielectric layer IMD4, and the first lower conductive layer M4 and at least a second lower conductive layer M4' are disposed in inter-metal dielectric layer IMD4, respectively in the memory region 200M and the logic region 200L. As shown in FIGS. 2H and 2I, the semiconductor structure 20 includes the dielectric layer 214 serving as a portion of the inter-metal dielectric layer IMD5, and the first upper conductive layer M5 and at least a second upper conductive layer such M5' are disposed in the inter-metal dielectric layer IMD5, respectively in the memory region 200M and the logic region 200L. Further, the semiconductor structure 20 further includes the conductors V4' disposed in the inter-metal dielectric layer IMD5 to electrically connect the metal layer M5' in the inter-metal dielectric layer IMD5 and the metal layer M4' in the inter-metal dielectric layer IMD4. In some embodiments, a height h3 of the memory cell 230 is less than a height h4 of the conductors V4'. In some embodiments, a sum of the height h3 and a height of the top conductor 242 is substantially equal to the height h4 of the conductors V4', but the disclosure is not limited to this.

Referring to FIGS. 2H and 2I, the memory device 230 is electrically connected to the access transistor 204 through the interconnect structure 210 and the contact plug CO in the memory region 200M. Further, the memory device 230 is electrically connected to a word line or a source line 244 through the interconnect structure 210, the contact plug CO and the access transistor 204, as shown in FIG. 2I. Further, other operations such as providing other electrical connection between the memory device 230 and a bit line (not shown) through the first upper conductive layer (i.e., M5 of the interconnect structure 210) can be performed. Additionally, the transistor 202 in the logic region 200L can be electrically connected to other circuitry or element through the interconnect structure 210 located in the logic region 200L.

Figure 3:
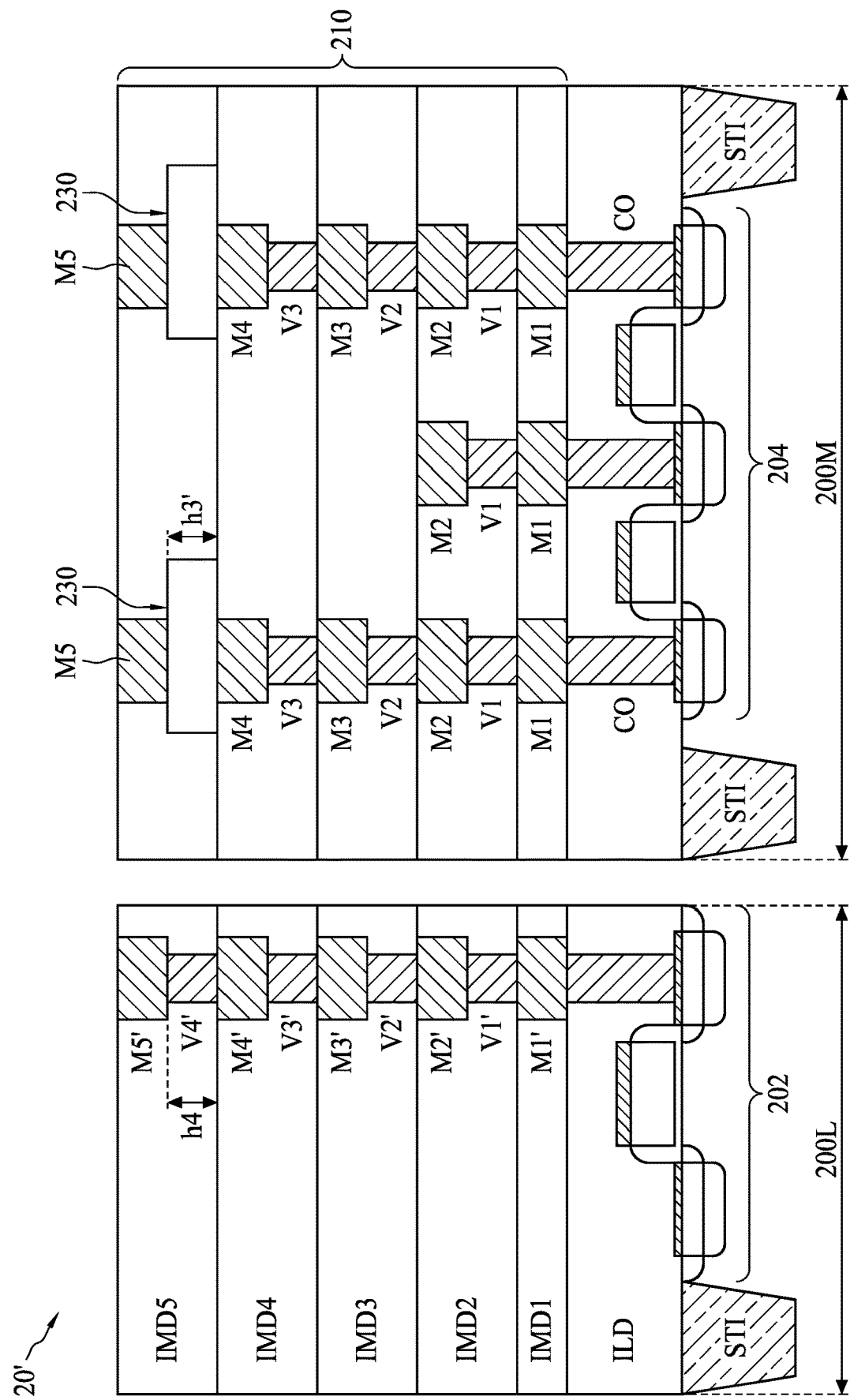
FIG. 3 is a schematic drawing illustrating a semiconductor memory structure according to aspects of the present disclosure in one or more embodiments.

Referring to FIG. 3, which is a schematic drawing illustrating a semiconductor memory structure 20' according to aspects of the present disclosure in one or more embodiments. It should be noted that elements same in FIGS. 2A-2I and FIG. 3 are designated by the same numerals. Further, those elements can include the same materials and be formed by the same operations, therefore those details are omitted in the interest of brevity and only differences are discussed. In some embodiments, the method for forming the semiconductor structure including the memory device 10 can be performed to form the semiconductor structure 20' and the memory device 230 is integrated in the interconnect structure 210. However, a height h3' of the memory cell 230 can be equal to the height h4 of the conductor V4'. Accordingly, the top electrode 232 of the memory device 203 is in contact with the first upper conductive layer, such as the metal layer M5 of the interconnect structure 210, as shown in FIG. 3.

Figure 4:
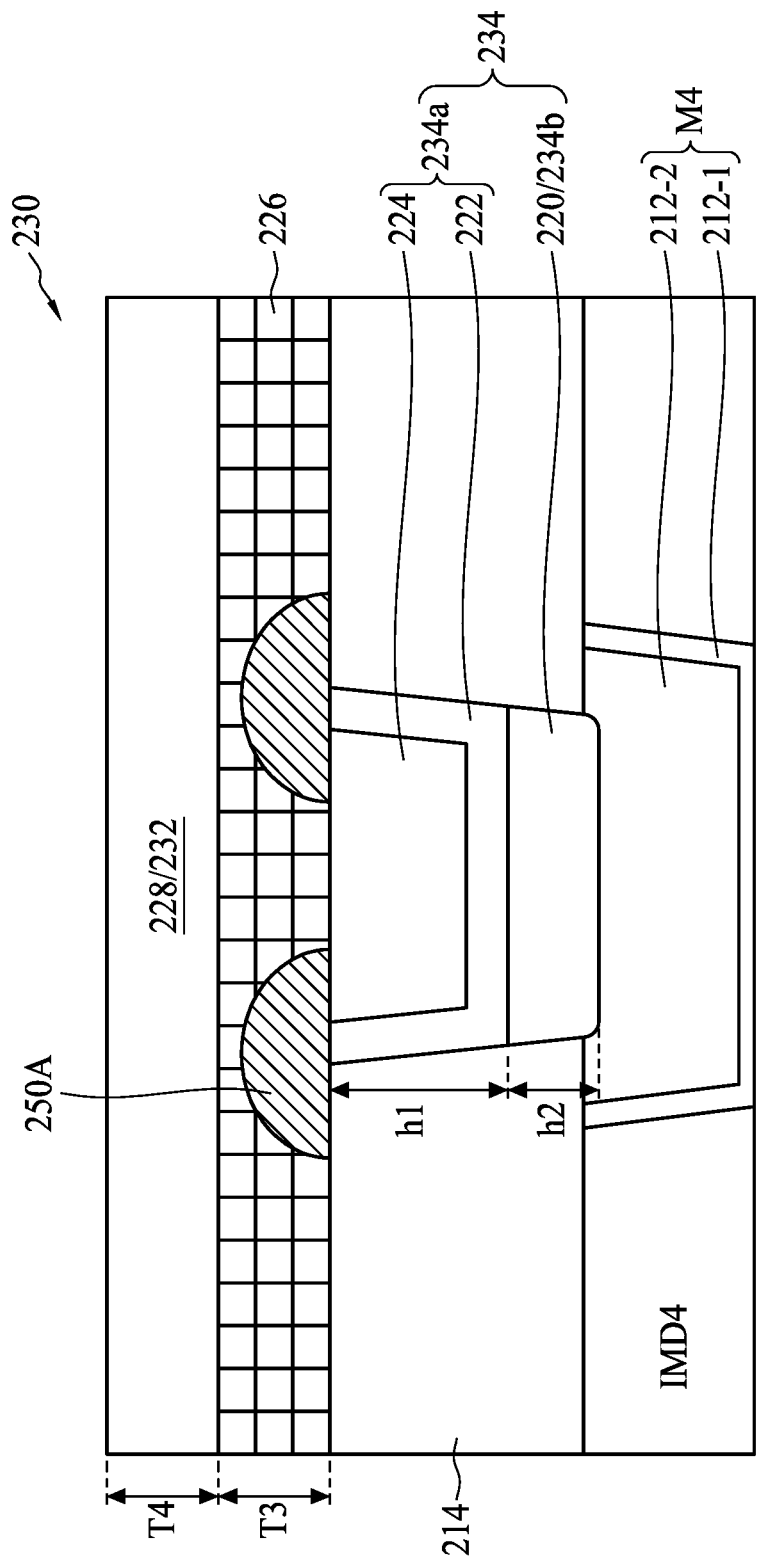
FIG. 4 is a schematic drawing illustrating the memory device in reset state according to aspects of the present disclosure in one or more embodiments.

Referring to FIG. 4, which is a schematic drawing illustrating the memory device in a reset state according to aspects of the present disclosure in one or more embodiments, since the resistivity of the heat-spreading layer 222 is greater than the resistivity of the bottom conductivity layer 220, heat is generated in and spread from the heat-spreading layer 222 when sufficient currents is applied to the heat-spreading layer 222. The phase change material 226 is heated up to a temperature higher than a melting temperature by the heat-spreading layer 222. The temperature can be quickly dropped below the crystallization temperature, which is referred as "quench", and thus a portion of the phase change material 226 is changed to an amorphous state with a high resistivity as schematically shown in region 250A in FIG. 4. Accordingly, the memory device 230 is in a high-resistance state and stores a data value of "0" in a reset state. Additionally, since the thermal conductivity of the bottom conductive layer 220 is greater than the thermal conductivity of the heat-spreading layer 222, heat can be quenched faster due to the bottom conductive layer 220. In other words, the quench operation is shortened. Additionally, it should be noted that the heat-spreading layer 222 is in a ring shape from a top plan view. Therefore, the region 250A is in a ring shape inherited from the heat-spreading layer 222.

Figure 5:
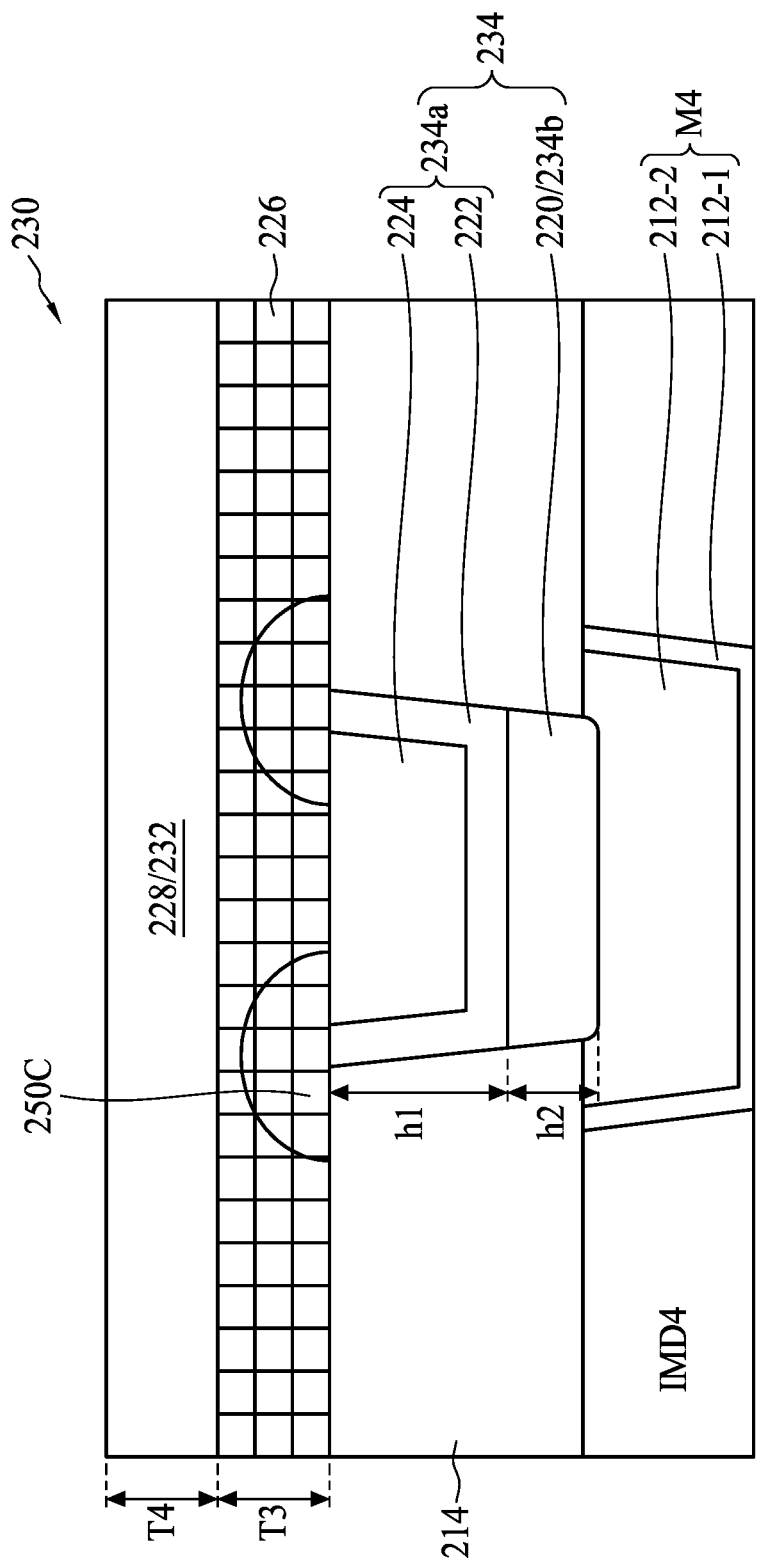
FIG. 5 is a schematic drawing illustrating the memory device in set state according to aspects of the present disclosure in one or more embodiments.

Referring to FIG. 5, which is a schematic drawing illustrating the memory device in a set state according to aspects of the present disclosure in one or more embodiments, the region 250A can be set back to the crystalline state by heating up the phase change material 226 to a temperature higher than the crystalline temperature but below the melting temperature by the heat-spreading layer 222, for a period time. Thus, the portion of the phase change material 226 is changed to a crystalline state with a low resistivity as schematically shown in region 250C in FIG. 5. Accordingly, the memory device 230 is in a low-resistance state and stores a data value of "1" in a set state. Additionally, it should be noted that the heat-spreading layer 222 is in a ring shape from a top plan view. Therefore, the region 250C is in a ring shape inherited from the heat-spreading layer 222.

Still referring to FIGS. 4 and 5, the bottom conductive layer 220, which includes resistivity lower than the heat-spreading layer 222, serves as the heat-buffering layer of the bottom electrode 234, as mentioned above. It should be noted that since the heat-spreading layer 222 is spaced apart from the first lower conductive layer M4 by the heat-buffering layer 220, heats are buffered by the heat-buffering layer 220. In other words, the first lower conductive layer M4 is in contact with the heat-buffering layer 220 which has the temperature lower than the heat-spreading layer 222, consequently the metal diffusion is reduced due to the lower temperature. Additionally, since the heat-buffering layer 220 includes the conductive material having diffusion barrier ability, the first lower conductive layer M4 can be enclosed by the diffusion barrier layers (i.e. the barrier layer 212-1 and the heat buffering layer 220) and thus the metal diffusion issue of the first lower conductive layer M4 is further mitigated. Accordingly, not only the performance and reliability of the memory device 230 is improved, but also the reliability of the interconnect structure 210 is improved.

Accordingly, the present disclosure therefore provides a semiconductor structure including a memory device and a method for forming the same. In some embodiments, a heat-buffering layer is introduced between the heat-spreading layer and the conductive layer of the interconnect structure, and thus heat required to cause the state change for the phase change material is buffered from the conductive layer in the interconnect structure. Consequently, metal diffusion and metal loss issue are both mitigated by the heat-buffering layer, and thus reliability of the phase change memory device and interconnect structure are both improved.

In some embodiments, a semiconductor structure including a memory device is provided. The semiconductor structure includes a first conductive layer and a second conductive layer, and a memory device between the first conductive layer and the second conductive layer. The memory device includes a top electrode, a bottom electrode adjacent to the first conductive layer, and a phase change material between the top electrode and the bottom electrode. The bottom electrode includes a first portion and a second portion between the first portion and the first conductive layer.

In some embodiments, a memory device is provided. The memory device includes a top electrode, a bottom electrode, a phase change material between the top electrode and the bottom electrode. The bottom electrode includes a first conductive layer, a second conductive layer between the first conductive layer and the top electrode, and a dielectric layer. A resistivity of the second conductive layer is greater than a resistivity of the first conductive layer.

In some embodiments, a method for forming a semiconductor structure is provided. The method includes following operations. A first conductive layer is formed. A first dielectric layer is formed over the first conductive layer, and the first dielectric layer includes at least one trench exposing the first conductive layer. A second conductive layer is formed in the trench. A third conductive layer is formed in the trench, and a resistivity of the third conductive layer is greater than a resistivity of the second conductive layer. A second dielectric layer is formed over the third conductive layer. A phase change material is formed over the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein.

What is claimed is:

1. A semiconductor structure comprising:
 a first lower conductive layer and a first upper conductive layer over the first lower conductive layer; and
 a memory device between the first lower conductive layer and the first upper conductive layer, the memory device comprising:
  a top electrode;
  a bottom electrode adjacent to the first lower conductive layer; and
  a phase change material between the top electrode and the bottom electrode;
  wherein the bottom electrode comprises:
   a first portion; and
   a second portion between the first portion and the first lower conductive layer, and the first portion and the second portion comprise different materials,
   wherein the first portion has a topmost surface facing the phase change material, and the topmost surface of the first portion is in contact with the phase change material.

2. The semiconductor structure of claim 1, wherein the first portion comprises a heat-spreading layer and a dielectric layer.

3. The semiconductor structure of claim 2, wherein a thickness of the second portion is greater than a thickness of the heat-spreading layer.

4. The semiconductor of structure of claim 3, wherein a resistivity of the second portion is less than a resistivity of the heat-spreading layer.

5. The semiconductor structure of claim 3, wherein the heat-spreading layer of the first portion is in a ring shape from a top plan view.

6. The semiconductor structure of claim 1, wherein a height of the first portion and a height of the second portion comprises a ratio, and the ratio is between about 4 and about 9.

7. The semiconductor structure of claim 1, further comprising a first dielectric layer and a second dielectric layer, wherein the first lower conductive layer is disposed in the first dielectric layer, and the first upper conductive layer and the memory device are disposed in the second dielectric layer.

8. The semiconductor structure of claim 7, further comprising a second lower conductive layer disposed in the first dielectric layer, a second upper conductive layer disposed in the second dielectric layer, and a conductor disposed in the second dielectric layer, wherein the conductor electrically connects the second lower conductive layer and the second lower conductive layer.

9. The semiconductor structure of claim 8, wherein a height of the memory cell is equal to or less than a height of the conductor.

10. The semiconductor structure of claim 1, further comprising a top conductor between the top electrode of the memory device and the first upper conductive layer.

11. The semiconductor structure of claim 1, wherein the top electrode is in physical contact with the first upper conductive layer.

12. A memory device comprising:
a top electrode;
a bottom electrode, the bottom electrode comprising:
a heat-buffering layer;
a heat spreading layer between the heat-buffering layer and the top electrode, wherein a resistivity of the heat spreading layer is greater than a resistivity of the heat-buffering layer; and
a dielectric layer, wherein a bottom and sidewalls of the dielectric layer are surrounded by the heat spreading layer; and
a phase change material between the bottom electrode and the top electrode.

13. The memory device of claim 12, wherein a height of the heat-buffering layer and a height of the heat spreading layer comprise a ratio, and the ratio is between about 4 and about 9.

14. The memory device of claim 12, wherein the heat spreading layer is in a ring shape.

15. The memory device of claim 12, wherein the heat-buffering layer is in physical contact with a bottom surface of the heat spreading layer.

16. A semiconductor structure comprising:
a first lower conductive layer in a first region and a second lower conductive layer in a second region, wherein the first lower conductive layer and the second lower conductive layer are separated from each other, and the first lower conductive layer and the second lower conductive layer are in a same level;
a conductor disposed over and coupled to the second lower conductive layer; and
a memory device over and coupled to the first lower conductive layer, the memory device comprising:
a top electrode;
a bottom electrode adjacent to the first lower conductive layer; and
a phase change material between the top electrode and the bottom electrode;
wherein the bottom electrode comprises:
a first portion; and
a second portion between the first portion and the first lower conductive layer, and the first portion and the second portion comprise different materials.

17. The semiconductor structure of claim 16, wherein a height of the memory device is equal to or less than a height of the conductor.

18. The semiconductor structure of claim 16, further comprising:
a first upper conductive layer disposed over and coupled to the memory device; and
a second upper conductive layer disposed over and coupled to the conductor, wherein the second upper layer is electrically connected to the second lower conductive layer by the conductor,
wherein the first upper conductive layer is separated from the second upper conductive layer.

19. The semiconductor structure of claim 16, wherein the first portion comprises a heat-spreading layer and a dielectric layer, and a resistivity of the second portion is less than a resistivity of the heat-spreading layer.

20. The semiconductor structure of claim 16, wherein a height of the first portion and a height of the second portion comprises a ratio, and the ratio is between about 4 and about 9.

* * * * *